United States Patent [19]
Duperray et al.

[11] Patent Number: 6,013,608
[45] Date of Patent: Jan. 11, 2000

[54] PROCESS FOR TEXTURING AN HTC SUPERCONDUCTOR AND SUPERCONDUCTOR MADE BY THE PROCESS

[75] Inventors: Gérard Duperray, La Norville; Peter Friedrich Herrmann, Corbreuse; Denis Legat, Lisses; Albert Leriche, Gif S/Yvette; Jean-Pierre Tavergnier, Linas, all of France

[73] Assignee: Alcatel, Paris, France

[21] Appl. No.: 09/095,494

[22] Filed: Jun. 11, 1998

[30] Foreign Application Priority Data

Jun. 12, 1997 [FR] France ................................. 97 07283

[51] Int. Cl.$^7$ .................................................. C04B 35/653
[52] U.S. Cl. .......................................... 505/450; 505/431
[58] Field of Search ..................... 505/431, 450, 505/501; 174/125.1

[56] References Cited

U.S. PATENT DOCUMENTS 5,635,456  6/1997  Riley, Jr. et al. ........................ 505/501

FOREIGN PATENT DOCUMENTS

93/22799  11/1993  WIPO .
94/23459  10/1994  WIPO .

*Primary Examiner*—Mark Kopec
*Attorney, Agent, or Firm*—Sughrue, Mion, Zinn Macpeak & Seas, PLLC

[57] ABSTRACT

A process for texturing an HTc superconductor of the matrix type based on silver and the superconductor material $(Bi_{1-x}Pb_x)_2Sr_2Ca_yCu_{1+y}O_{6+2y}$ where $x \in [0; 0,4]$ and $y \in \{0, 1, 2\}$ includes the following steps carried out in succession: raising the temperature of the superconductor from room temperature to the melting point of the superconductor material, maintaining the temperature of the superconductor constant at the melting point of the superconductor material for a relatively short period, varying the temperature of the superconductor between the melting point of the superconductor material and its synthesis temperature, maintaining the temperature of the superconductor constant at the synthesis temperature of the superconductor material for a relatively long period and reducing the temperature of the superconductor from the synthesis temperature of the superconductor material to room temperature. The step of varying the temperature of the superconductor between the melting point of the superconductor material and its synthesis temperature comprises sudden cooling of the superconductor from the melting point of the superconductor material to an end of cooling temperature less than the synthesis temperature of the superconductor material, and raising the temperature of the superconductor from the end of cooling temperature to the synthesis temperature of the superconductor material.

4 Claims, 2 Drawing Sheets

PROCESS FOR TEXTURING AN HTC SUPERCONDUCTOR AND SUPERCONDUCTOR MADE BY THE PROCESS

BACKGROUND OF THE INVENTION

1. Field of the Invention

The invention concerns a process for texturing an HTc superconductor of the matrix type based on silver and the superconductor material $(Bi_{1-x}Pb_x)_2Sr_2Ca_yCu_{1+y}O_{6+2y}$ where $x \in [0; 0,4]$ and $y \in \{0, 1, 2\}$, and a superconductor of this kind textured by this process. The invention is more particularly concerned with a silver-based matrix multifilament superconductor.

2. Description of the Prior Art

HTc superconductors of the matrix type based on silver and the superconductor material $(BI_{1-x}PBS_x)_2SR_2Ca_yCu_{1+y}O_{6+2y}$ where $x \in [0; 0,4]$ and $y \in \{0, 1, 2\}$ towards the superconductor phase is effected by heat treatment. Texturing processes typically comprise the following steps:

- raising the temperature of the superconductor from room temperature to the melting point of the superconductor material;
- maintaining the temperature of the superconductor constant for a relatively short time at the melting point of the superconductor material;
- reducing the temperature of the superconductor from the melting point of the superconductor material to the temperature of synthesis of the superconductor material at a temperature gradient in the order of 1° C. to 5° C. per hour;
- maintaining the temperature of the superconductor constant for a relatively long time (between 25 hours and 70 hours) at the temperature of synthesis of the superconductor material; and
- reducing the temperature of the superconductor from the temperature of synthesis of the superconductor material to room temperature.

In the case of multifilament superconductors texturing produces a very high current transmission capacity.

However, reducing the temperature of the superconductor between the melting point of the superconductor material and its synthesis temperature at the rate of 1° C. to 5° C. per hour takes several hours. During this period the components constituting the superconductor material, which are molten and highly reactive, form dendritic inserts through the silver matrix. Because of this, the decoupling of the filaments 3 is very poor (FIG. 1). The presence of many short-circuits 1 restricts the use of such superconductors to direct current applications.

Using HTc multifilament superconductors for alternating currents causes induced current losses. It is known to reduce such losses by twisting the superconductor with a small lay and reducing the diameter of the filaments. However, this is effective only if the filament are electrically decoupled from each other by a resistive barrier.

An aim of the present invention is to propose a method of texturing HTc superconductors of the matrix type based on silver and the superconductor material $(Bi_{1-x}Pb_x)_2Sr_2Ca_yCu_{1+y}O_{6+2y}$ where $x \in [0; 0,4]$ and $y \in \{0, 1, 2\}$ towards the superconductor phase which limits the formation of such inserts.

Another aim of the present invention is to propose a multifilament HTc superconductor of the matrix type based on silver and the superconductor material $(Bi_{1-x}Pb_x)_2Sr_2Ca_yCu_{1+y}O_{6+2y}$ where $x \in [0; 0, 4]$ and $y \in \{0, 1, 2\}$ having performance in terms of current density better than 2 400 A/mm$^2$ and sufficient inter-filament decoupling for alternating current applications.

SUMMARY OF THE INVENTION

To this end the invention concerns a process for texturing an HTc superconductor of the matrix type based on silver and the superconductor material $(Bi_{1-x}Pb_x)_2Sr_2Ca_yCu_{1+y}O_{6+2y}$ where $x \in [0; 0,4]$ and $y \in \{0, 1, 2\}$ comprising the following steps carried out in succession:

- raising the temperature of the superconductor from room temperature to the melting point of the superconductor material,
- maintaining the temperature of the superconductor constant at the melting point of the superconductor material for a relatively short time,
- varying the temperature of the superconductor between the melting point of the superconductor material and its synthesis temperature
- maintaining temperature of the superconductor constant at the synthesis temperature of the superconductor material for a relatively long time, and
- reducing the temperature of the superconductor from the synthesis temperature of the superconductor material to room temperature, in which process the step of varying the temperature of the superconductor between the melting point of the superconductor material and its synthesis temperature comprises:

- sudden cooling of the superconductor from the melting point of the superconductor material to an end of cooling temperature lower than the synthesis temperature of the superconductor material, and
- heating the superconductor from the end of cooling temperature to the synthesis temperature of the superconductor material.

The superconductor can be a multifilament superconductor made by a "PIT" (Powder In Tube) type process.

The process can be applied to a superconductor material still in the form of incompletely synthesized precursors.

The process can also be applied to a superconductor material already synthesized in the superconductor phase.

The invention also concerns a multifilament HTc superconductor of the matrix type based on silver and the superconductor material $(Bi_{1-x}Pb_x)_2Sr_2Ca_yCu_{1+y}O_{6+2y}$ where $x \in [0; 0,4]$ and $y \in \{0, 1, 2\}$ textured by the above process.

In accordance with the invention, the multifilament HTc superconductor has fewer than one short-circuit between filaments per 100 μm of superconductor.

A first advantage of the method of the invention results from the significant reduction in the number of inserts between filaments.

Another advantage of the present invention results from the significant decrease in the duration of the texturing treatment. The duration of the step of varying the temperature of the superconductor between the melting point of the superconductor material and its synthesis temperature is typically in the order of 20 hours (1° C. to 5° C. per hour). In the process of the present invention this is reduced to two hours or less.

A third advantage of the process of the present invention results from the fact that it does not necessitate any additional equipment over and above that used in the prior art, as only the programming of the furnace needs to be modified.

Other advantages and features of the present invention will emerge from the following description given with reference to the accompanying drawings.

DETAILED DESCRIPTION OF THE PREFERRED EMBODIMENT

Figure 3B:
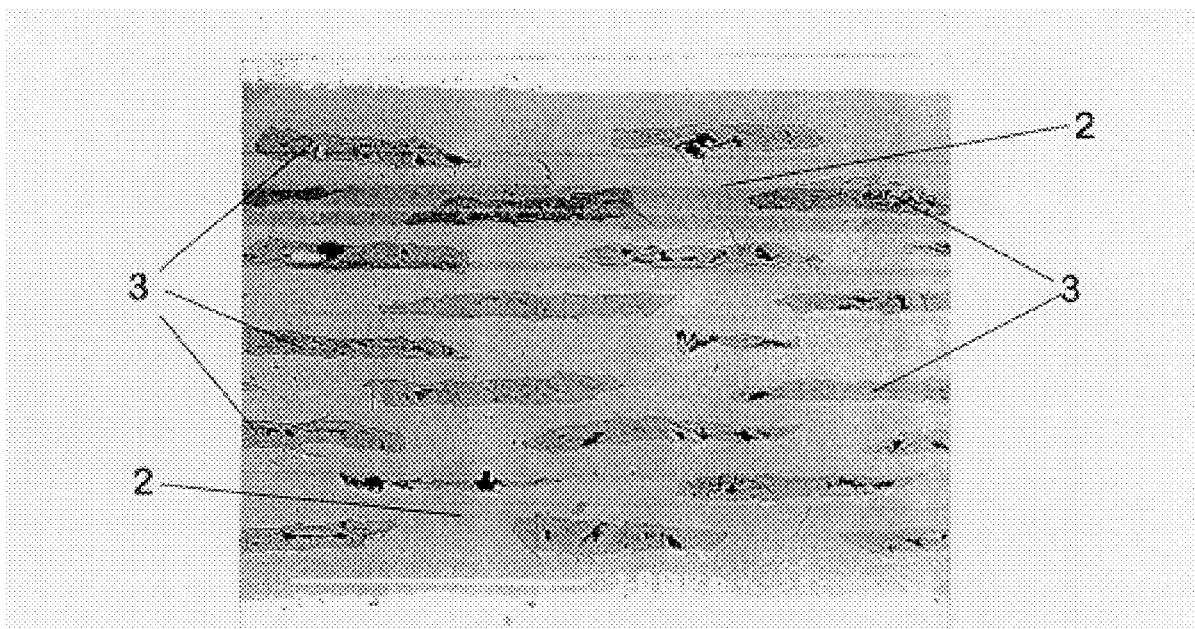
FIGS. 3A, 3B respectively show a multifilament superconductor in accordance with the invention in longitudinal section and in cross-section.
Figure 1:
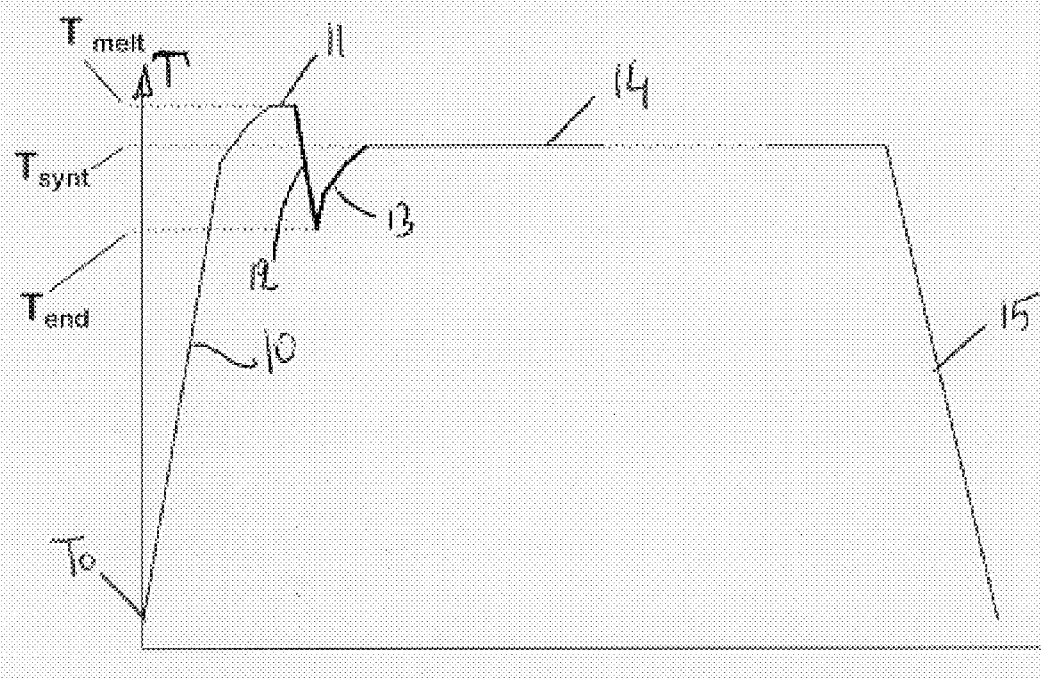
FIG. 1 is a schematic temperature curve for the texturing process of the invention.
Figure 2:
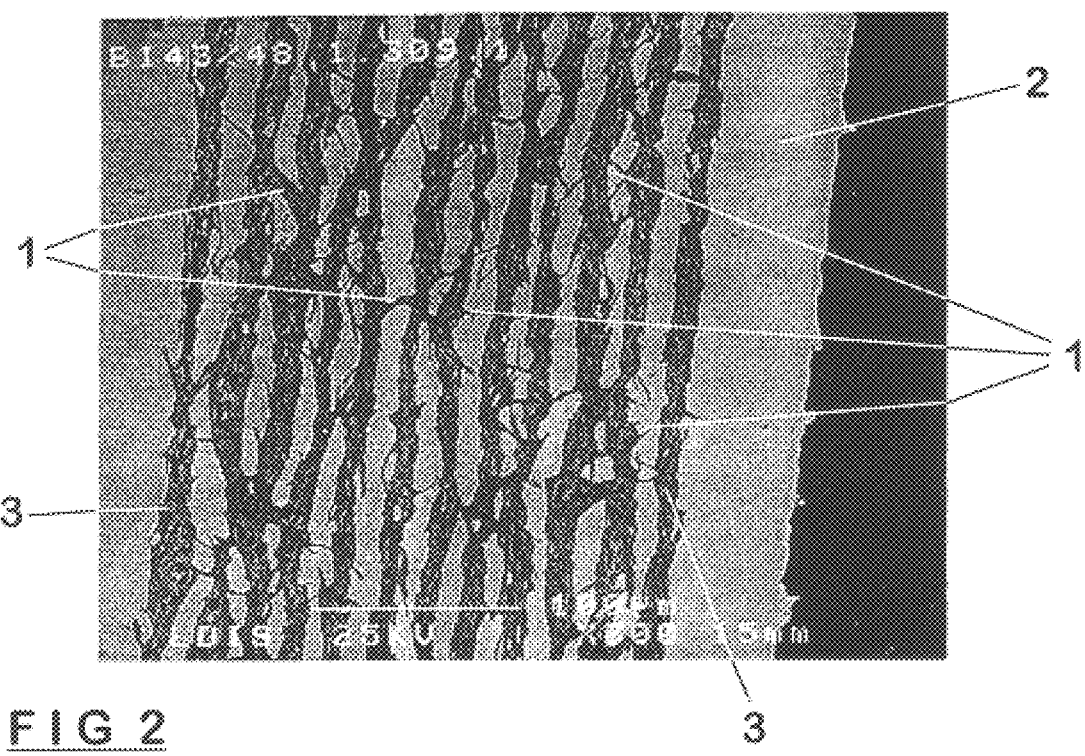
FIG. 2 shows a multifilament superconductor made by prior art processes in longitudinal section.
Figure 3A:
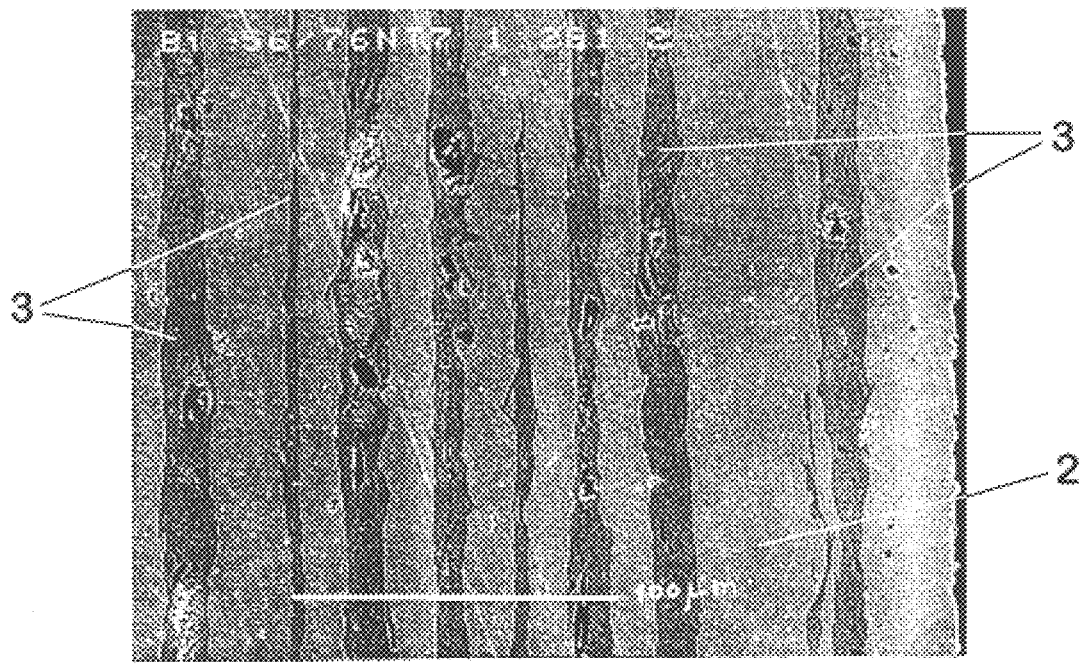

In the following description the following terms have the following meanings:

Superconductor material: a material either already in the superconductor phase or in the form of precursors which, after adequate heat treatment, will be synthesized into the superconductor phase.

Superconductor material melting point: the temperature above which at least some of the components of the superconductor material are in the liquid phase.

Superconductor material synthesis temperature: the temperature at which the superconductor phase of the material is synthesized.

The process in accordance with the invention for texturing an HTc superconductor of the matrix type based on silver and the superconductor material $(Bi_{1-x}Pb_x)_2Sr_2Ca_yCu_{1+y}O_{6+2y}$ where $x \in [0; 0,4]$ and $y \in \{0, 1, 2\}$ comprises, in succession:

Raising the temperature of the superconductor from room temperature To to the melting point $T_{melt}$ of the superconductor material (step 10). During this step the material, whether initially in the synthesized form or not, is not in the superconductor phase.

Maintaining the temperature of the superconductor constant at the melting point $T_{melt}$ of the superconductor material for a relatively short time (step 11). The aim of this step is to achieve homogeneous melting within the material.

Varying the temperature of the superconductor between the melting point $T_{melt}$ of the superconductor material and its synthesis temperature $T_{synt}$ (step 16), this step comprising the following sub-steps:

Sudden cooling of the superconductor from the melting point $T_{melt}$ of the superconductor material to an end of cooling temperature $T_{end}$ (step 12), said end of cooling temperature $T_{end}$ being lower than the synthesis temperature $T_{synt}$ of the superconductor material. During this sudden solidification, after the constant temperature period at $T_{melt}$, the components are cooled in the form of crystallized or vitreous precursors having a fine granular structure.

Controlled heating of the superconductor from the end of cooling temperature $T_{end}$ to the synthesis temperature $T_{synt}$ of the superconductor material (step 13). The combination of the previous two sub-steps enables synthesis of the fine precursor grains into the superconductor phase. The semi-solid state of the components approaching the synthesis temperature $T_{synt}$ of the superconductor material from below enables the formation of a dense and textured material having virtually no dendritic excrescences or inserts, as in the prior art.

Maintaining the temperature of the superconductor constant at the synthesis temperature $T_{synt}$ of the superconductor material for a relatively long time (step 14). This step enables complete synthesis of the material.

Reducing the temperature of the superconductor from the synthesis material $T_{synt}$ of the superconductor material to room temperature $T_0$ (step 15).

The method can be applied at various stages in the fabrication of a multifilament superconductor by the powder in tube (PIT) technique.

This technique entails filling a tube with powder reagents converted, after heat treatment, into an HTc ceramic type superconductor material. The process of the invention is concerned with said heat treatment.

The tube is then closed in a vacuum and drawn down, placed in a bundle in a new tube which is then closed in vacuum and drawn down in its turn. The resulting multifilament wire can be subjected to the same operations, and this procedure repeated until the required number of filaments per unit surface area is obtained.

The wire made in this way is then formed to its final shape, for example by rolling and/or twisting it. It is then heated to convert the powder reagents.

The heat treatment of the invention can be applied at various levels of the powder in tube fabrication technique.

For example it can be applied several times following the monofilament step and a certain number of multifilament steps or once only after the step of shaping the multifilament superconductor before or after twisting, etc.

Accordingly, the superconductor material undergoing the process in accordance with the invention can obviously be initially in the form of unsynthesized precursors or the synthesized superconductor phase; raising the temperature to $T_{melt}$ (step 10) reinitializes the components as precursors regardless of their initial state.

The invention also concerns a multifilament HTc superconductor of the matrix type based on silver and the superconductor material $(Bi_{1-x}Pb_x)_2Sr_2Ca_yCu_{1+y}O_{6+2y}$ where $x \in [0; 0,4]$ and $y \in \{0, 1, 2\}$ textured by the process of the invention. This multifilament superconductor has an average number of short-circuits 1 between filaments 3 less than one per 100 $\mu$m of superconductor for current densities greater than 2 400 A/mm$^2$. This makes it usable for alternating current applications requiring a high current density. If the superconductor made in this way is subsequently subjected to a twisting step it features less than one short-circuit between filaments per twist lay.

In one non-limiting example with a partial oxygen pressure of 3%:

The melting point $T_{melt}$ is in the range 850° C. to 880° C.

The sudden cooling (step 12) is carried out with a temperature gradient in the order of 240°/hour for approximately 30 minutes so $T_{end}$ is in the range 730° C. to 760° C.

The controlled heating (step 13) takes between 1 hour and 1 hour 40 minutes to increase the temperature from $T_{end}$ to the synthesis temperature $T_{synt}$ which is in the range 770° C. to 840° C. according to the coefficients of the components of the material.

The process of the invention can be used to fabricate Bi2223 or Bi2212 type multifilament HTc superconductors, for example.

Of course, the invention is not limited to the embodiment described and shown but is open to many variants that do not depart from the scope of the invention and that will be evident to the skilled person. In particular, the partial oxygen pressure can be modified without departing from the scope of the invention, which will of course influence the temperature ranges proposed in the illustrative example given above. The cross-section of the superconductor in accordance with the invention can be different to that shown, for example round or hexagonal, without departing from the scope of the invention. The disposition of the filaments within the superconductor can also be different without departing from the scope of the invention.

There is claimed:

1. A process for texturing an HTc superconductor of the matrix based on silver and the superconductor material $(Bi_{1-x}Pb_x)_2Sr_2Ca_yCu_{1+y}O_{6+2y}$ where $0 \leq x \leq 0.4$ and y is 0, 1 or 2 comprising the following steps carried out in succession:

raising the temperature of said superconductor from room temperature to the melting point of said superconductor material, maintaining the temperature of said superconductor constant at said melting point of said superconductor material for a relatively short time, varying the temperature of said superconductor between said melting point of said superconductor material and its synthesis temperature maintaining the temperature of said superconductor constant at said synthesis temperature of said superconductor material for a relatively long time, and reducing the temperature of said superconductor from said synthesis temperature of said superconductor material to room temperature, in which process the step of varying the temperature of said superconductor between said melting point of said superconductor material and its synthesis temperature comprises:

sudden cooling of said superconductor from said melting point of said superconductor material to an end of cooling temperature lower than said synthesis temperature of said superconductor material, and heating said superconductor from said end of cooling temperature to said synthesis temperature of said superconductor material.

2. The process claimed in claim 1 wherein said superconductor is a multifilament superconductor.

3. The process claimed in claim 1 wherein said superconductor material is initially in the form of unsynthesized precursors.

4. The process claimed in claim 1 wherein said superconductor material is initially in the synthesized superconductor phase.

* * * * *